United States Patent
Park et al.

(10) Patent No.: US 8,987,832 B2
(45) Date of Patent: Mar. 24, 2015

(54) NONVOLATILE MEMORY INCLUDING MEMORY CELL ARRAY HAVING THREE-DIMENSIONAL STRUCTURE

(71) Applicants: Jintaek Park, Hwaseong-si (KR); Youngwoo Park, Seoul (KR)

(72) Inventors: Jintaek Park, Hwaseong-si (KR); Youngwoo Park, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/080,823

(22) Filed: Nov. 15, 2013

(65) Prior Publication Data

US 2014/0151783 A1 Jun. 5, 2014

(30) Foreign Application Priority Data

Dec. 4, 2012 (KR) ........................ 10-2012-0139781

(51) Int. Cl.
*H01L 27/088* (2006.01)
*H01L 27/115* (2006.01)
(Continued)

(52) U.S. Cl.
CPC .... *H01L 27/11578* (2013.01); *H01L 27/11551* (2013.01); *H01L 27/2481* (2013.01); *H01L 29/4234* (2013.01); *H01L 29/792* (2013.01)
USPC .......................................... 257/390; 257/401

(58) Field of Classification Search
CPC ............ H01L 27/2481; H01L 27/0688; H01L 27/11578; H01L 27/11551
USPC ......................................... 257/314, 390, 401
See application file for complete search history.

(56) References Cited

U.S. PATENT DOCUMENTS 7,924,662 B2 4/2011 Ho
8,159,880 B2 4/2012 Sato et al.
(Continued)

FOREIGN PATENT DOCUMENTS

CN 101447229 A 6/2009
JP 2010092559 A 4/2010
(Continued)

OTHER PUBLICATIONS

Ryota Katsumat, et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, 7-1, pp. 136-137.

*Primary Examiner* — Ngan Ngo
(74) *Attorney, Agent, or Firm* — Myers Bigel Sibley & Sajovec, P.A.

(57) ABSTRACT

A nonvolatile memory is provided which includes a plurality of channel layers and a plurality of insulation layers alternately stacked on a substrate in a direction perpendicular to the substrate, each of the plurality of channel layers including a plurality of channel films extending along a first direction on a plane parallel with the substrate; a plurality of conductive materials extending from a top of the channel layers and the insulation layers up to a portion adjacent to the substrate in a direction perpendicular to the substrate through areas among channel films of each channel layer; a plurality of information storage films provided between the channel films of the channel layers and the conductive materials; and a plurality of bit lines connected to the channel layers, respectively, wherein the conductive materials, the information storage films, and the channel films of the channel layers form a three-dimensional memory cell array, wherein the conductive materials form a plurality of groups, and wherein a distance between the groups is longer than a distance between conductive materials in each other.

20 Claims, 15 Drawing Sheets

(51) Int. Cl.
*H01L 27/24* (2006.01)
*H01L 29/423* (2006.01)
*H01L 29/792* (2006.01)

(56) References Cited

U.S. PATENT DOCUMENTS

| | | |
|---|---|---|
| 8,203,882 B2 | 6/2012 | Hishida et al. |
| 2008/0219053 A1 | 9/2008 | Kim |
| 2010/0226179 A1 | 9/2010 | Kim |
| 2010/0226183 A1 | 9/2010 | Kim |
| 2011/0222340 A1 | 9/2011 | Lee et al. |
| 2012/0218829 A1 | 8/2012 | Kim |
| 2013/0043453 A1* | 2/2013 | Baek et al. ............... 257/4 |
| 2014/0063938 A1* | 3/2014 | Oh et al. ............ 365/185.02 |
| 2014/0140131 A1* | 5/2014 | Yeh et al. ............ 365/185.05 |
| 2014/0227841 A1* | 8/2014 | Lee et al. .................. 438/268 |
| 2014/0291605 A1* | 10/2014 | Ju et al. ........................ 257/4 |

FOREIGN PATENT DOCUMENTS

| | | |
|---|---|---|
| KR | 1020080061937 A | 7/2008 |
| KR | 1020090017237 A | 2/2009 |
| KR | 1020100015423 A | 2/2010 |
| KR | 1020110132584 A | 12/2011 |
| KR | 1020110136643 A | 12/2011 |
| TW | 200907981 A | 2/2009 |
| WO | WO 2008/106778 A1 | 9/2008 |
| WO | WO 2010/099597 A1 | 9/2010 |

* cited by examiner

NONVOLATILE MEMORY INCLUDING MEMORY CELL ARRAY HAVING THREE-DIMENSIONAL STRUCTURE

CROSS-REFERENCE TO RELATED APPLICATION

A claim for priority under 35 U.S.C. §119 is made to Korean Patent Application No. 10-2012-0139781, filed Dec. 4, 2012 in the Korean Intellectual Property Office, the entire contents of which are hereby incorporated by reference herein.

BACKGROUND

The inventive concepts described herein relate to a semiconductor memory device, and more particularly, relate to a nonvolatile memory including a three-dimensional memory cell array.

A semiconductor memory device is a memory device which is fabricated using semiconductors such as silicon (Si), germanium (Ge), gallium arsenide (GaAs), indium phosphide (InP), and the like. Semiconductor memory devices are classified into volatile memory devices and nonvolatile memory devices.

Volatile memory devices may lose stored contents when the power to the device is cut-off. Example volatile memory devices include static Random Access Memory (RAM) devices (SRAM), dynamic RAM (DRAM), synchronous DRAM (SDRAM), and the like. Nonvolatile memory devices may retain stored contents even when power to the device is cut-off. Example nonvolatile memory devices include read only memory (ROM) devices, programmable ROM (PROM), electrically programmable ROM (EPROM), electrically erasable and programmable ROM (EEPROM), flash memory devices, phase-change RAM (PRAM), magnetic RAM (MRAM), resistive RAM (RRAM), ferroelectric RAM (FRAM), and the like. Flash memory devices include both NOR type and NAND type flash memory devices.

In recent years, research on three-dimensional semiconductor memory devices has been conducted in an effort to obtain semiconductor memory devices having a higher degree of integration.

SUMMARY

One aspect of embodiments of the inventive concept provides a nonvolatile memory which comprises a plurality of channel layers and a plurality of insulation layers alternately stacked on a substrate in a direction perpendicular to a major surface of the substrate, each of the plurality of channel layers including a plurality of channel films extending along a first direction, and each of the plurality of channel layers disposed in a respective one of a plurality of planes that are parallel to the major surface of the substrate; a plurality of conductive materials that each extend downwardly from a top of the channel layers and the insulation layers in a direction perpendicular to the substrate to at least partially cover at least one side surface of each channel film; a plurality of information storage films provided between the channel films of the channel layers and the conductive materials; and a plurality of bit lines connected to the channel layers, respectively, wherein the conductive materials, the information storage films, and the channel films of the channel layers form a three-dimensional memory cell array, wherein the conductive materials are arranged into at least first and second groups that are adjacent to each other, with each of the first and second groups including a plurality of adjacent ones of the conductive materials, and wherein a distance between the first group and the second group is longer than a distance between adjacent conductive materials in the first group.

In example embodiments, the conductive materials comprise word lines.

In example embodiments, the nonvolatile memory device is configured to independently erase the first and second groups.

In example embodiments, at an erase operation, a low voltage is applied to the conductive materials of the first group to erase memory cells associated with the conductive materials of the first group, while the conductive materials of the second group are floated.

In example embodiments, at an erase operation, a low voltage is applied to conductive materials of the first group to erase memory cells associated with the conductive materials of the first group and a voltage higher than the low voltage and lower than a voltage that is supplied to the channel films is applied to the conductive materials of the second group so that memory cells associated with the conductive materials of the second group are not erased.

In example embodiments, each channel film is electrically connected to a respective one of the plurality of bit lines through a respective one of a plurality of string selection transistors.

In example embodiments, the nonvolatile memory further comprises a common source line connected to sides of the channel films that are opposite to the sides of the channel films that are connected to the bit lines.

In example embodiments, the channel films are connected in common to the common source line through a plurality of ground selection transistors respectively.

In example embodiments, the nonvolatile memory further comprises a dummy word line that is interposed between the conductive materials of the first group and the conductive materials of the second group.

Another aspect of embodiments of the inventive concept is directed to a nonvolatile memory which comprises a plurality of channel layers and a plurality of insulation layers that are alternately stacked on a substrate in a direction perpendicular to a major surface of the substrate, each of the plurality of channel layers including a plurality of channel films, and each of the plurality of channel layers disposed in a respective one of a plurality of planes that are parallel to the major surface of the substrate; a plurality of conductive materials that each extend downwardly from a top of the channel layers and the insulation layers in a direction perpendicular to the major surface of the substrate to at least partially cover at least one side surface of each channel film; a plurality of information storage films provided between the channel films of the channel layers and the conductive materials; and a plurality of bit lines connected to the channel layers, respectively, wherein the conductive materials, the information storage films, and the channel films of the channel layers form a three-dimensional memory cell array, wherein the conductive materials are arranged as a first group including two or more conductive materials, a second group including two or more other conductive materials, and a third group including at least another conductive material that is between the first group and the second group, and wherein the nonvolatile memory is configured to erase the first group independent of the second group.

In example embodiments, each conductive material in the first group and in the second group comprises a respective word line and the conductive material in the third group comprises a dummy word line.

In example embodiments, the nonvolatile memory is configured so that the memory cells corresponding to the first group are erased when a low voltage is supplied to the conductive materials of the first group and the conductive materials of the second and third groups are floated.

In example embodiments, when memory cells corresponding to the first group are erased, a low voltage is supplied to the conductive materials of the first group, the conductive materials of the third group are floated, and a voltage higher than the low voltage and lower than a voltage supplied to the channel films is applied to the conductive materials of the second group.

In example embodiments, a first erase count corresponding to the first group increases when an erase operation on the first group is performed and a second erase count corresponding to the second group increases when an erase operation on the second group is performed.

In example embodiments, an erase count corresponding to the first and second groups increases when an erase operation on the first group is performed, and the erase count corresponding to the first and second groups increases when an erase operation on the second group is performed.

With embodiments of the inventive concept, a memory block may be divided into two or more sub-blocks. Thus, a time taken to perform merge or garbage collection may be reduced, and an operating speed of a nonvolatile memory may be improved.

Another aspect of embodiments of the inventive concept is directed to a nonvolatile memory that includes a stacked structure that has a plurality of channel films and a plurality of insulation layers that are alternately stacked on a substrate in a direction perpendicular to a major surface of the substrate, where each of the plurality of channel films lies in a respective one of a plurality of planes that are parallel to the major surface of the substrate, and each of the plurality of channel films extending along a first direction. The nonvolatile memory further includes a plurality of conductive materials that each extend from a top of the stacked structure and along at least one side surface of the stacked structure to at least partially cover a respective side surface of each of the plurality of channel films. A plurality of information storage films are provided between the channel films and the conductive materials. Finally, a plurality of bit lines are electrically connected to respective ones of the channel films. The conductive materials, the information storage films, and the channel films are part of a three-dimensional memory cell array. The conductive materials are arranged into at least first and second groups that are adjacent to each other, with each of the first and second groups including a plurality of adjacent ones of the conductive materials. A distance between the first group and the second group is greater than a distance between adjacent conductive materials in the first group.

In example embodiments, the nonvolatile memory is configured to erase memory cells associated with the first group independently of memory cells associated with the second group In example embodiments, the conductive materials comprise word lines.

In example embodiments, a dummy word line is further provided that is interposed between the conductive materials of the first group and the conductive materials of the second group.

In example embodiments, the conductive material of the first group that is farthest from the conductive materials of the second group is wider than the remainder of the conductive materials of the first group, and the conductive material of the second group that is farthest from the conductive materials of the first group is wider than the remainder of the conductive materials of the second group.

DETAILED DESCRIPTION

Figure 1:
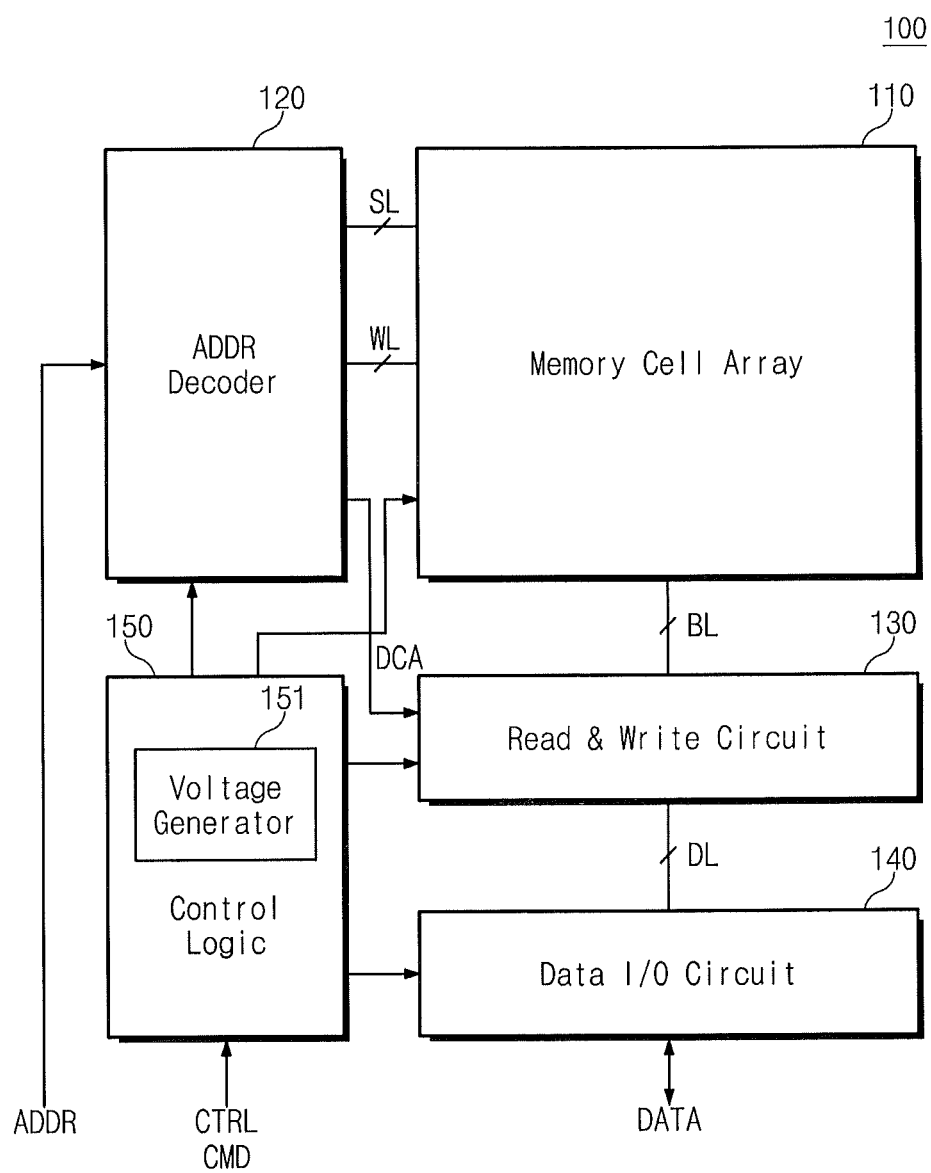
FIG. 1 is a block diagram schematically illustrating a nonvolatile memory according to an embodiment of the inventive concept.

Embodiments are described in detail below with reference to the accompanying drawings. The inventive concept, however, may be embodied in various different forms, and should not be construed as being limited only to the illustrated embodiments. Rather, these embodiments are provided as examples so that this disclosure will be thorough and complete, and will fully convey the inventive concepts to those skilled in the art. Accordingly, known processes, elements, and techniques are not described with respect to some of the embodiments of the inventive concept. Unless otherwise noted, like reference numerals denote like elements throughout the attached drawings and written description, and thus descriptions will not be repeated. In the drawings, the sizes and relative sizes of layers and regions may be exaggerated for clarity.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the inventive concept.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the exemplary terms "below" and "under" can encompass both an orientation of above and below. The device may be otherwise oriented (rotated 90 degrees or at other orientations) and the spatially relative descriptors used herein interpreted accordingly. In addition, it will also be understood that when a layer is referred to as being "between" two layers, it can be the only layer between the two layers, or one or more intervening layers may also be present.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises," "comprising," "includes" and/or "including," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "exemplary" is intended to refer to an example or illustration.

It will be understood that when an element or layer is referred to as being "on", "connected to", "coupled to", or "adjacent to" another element or layer, it can be directly on, connected, coupled, or adjacent to the other element or layer, or intervening elements or layers may be present. In contrast, when an element is referred to as being "directly on," "directly connected to", "directly coupled to", or "immediately adjacent to" another element or layer, there are no intervening elements or layers present.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

FIG. 1 is a block diagram schematically illustrating a nonvolatile memory 100 according to an embodiment of the inventive concept. Referring to FIG. 1, the nonvolatile memory 100 may include a memory cell array 110, an address decoder 120, a read/write circuit 130, a data input/output (I/O) circuit 140, and control logic 150.

The memory cell array 110 may be connected to the address decoder 120 via word lines WL and selection lines SL and may be connected to the read/write circuit 130 via bit lines BL. The memory cell array 110 may include a plurality of memory cell transistors. For example, the memory cell array 110 may include memory cell transistors stacked in a direction normal to a substrate of the device that form a three-dimensional memory cell array. Exemplarily, the memory cell array 110 may be formed of memory cell transistors each of which stores one or more bits of data.

The address decoder 120 may be connected to the memory cell array 110 via the word lines WL and the selection lines SL. The address decoder 120 may operate in response to control signals from the control logic 150. The address decoder 120 may receive an address ADDR from an external device.

The address decoder 120 may decode a row address of the input address ADDR to select a word line that corresponds to the decoded row address from among the word lines WL. The address decoder 120 may select a selection line, corresponding to the decoded row address, from among the selection lines SL.

In embodiments where the address decoder 120 is additionally connected with the memory cell array 110 via dummy word lines DWL (not shown), the address decoder 120 may further select a dummy word line, corresponding to the decoded row address, from among the dummy word lines DWL.

The address decoder 120 may decode a column address of the input address ADDR to transfer it to the read/write circuit 130.

In example embodiments, the address decoder 120 may include elements such as a row decoder to decode a row address, a column decoder to decode a column address, an address buffer to store an input address ADDR, and so on.

The read/write circuit 130 may be connected to the memory cell array 110 via the bit lines BL. The read/write circuit 130 may be connected to the data input/output circuit 140 via data lines DL. The read/write circuit 130 may operate responsive to control signals from the control logic 150. The read/write circuit 130 may select the bit lines BL in response to the decoded column address DCA from the address decoder 120.

In example embodiments, the read/write circuit 130 may receive data from the data input/output circuit 140 that is to be written to the memory cell array 110. The read/write circuit 130 may read data from the memory cell array 110 to output it to the data input/output circuit 140. The read/write circuit 130 may read data from the first storage area of the memory cell array 110 to write it in the second storage area thereof. That is, the read/write circuit 130 may perform a copy-back operation.

In example embodiments, the read/write circuit 130 may include constituent elements such as a page buffer (or, a page register), a column selecting circuit, and the like. In other example embodiments, the read/write circuit 130 may include constituent elements such as a sense amplifier, a write driver, a column selecting circuit, and the like.

The data input/output circuit 140 may be connected to the read/write circuit 130 via the data lines DL. The data input/output circuit 140 may operate responsive to control signals from the control logic 150. The data input/output circuit 140 may be configured to exchange data DATA with an external device. The data input/output circuit 140 may be configured to transfer data provided from the external device to the read/write circuit 130 via the data lines DL. The data input/output circuit 140 may be configured to output data transferred from the read/write circuit 130 via the data lines DL to the external device. In example embodiments, the data input/output circuit 140 may include a constituent element such as a data buffer.

The control logic 150 may be connected to the address decoder 120, the read/write circuit 130, and the data input/output circuit 140. The control logic 150 may be configured to control the overall operation of the nonvolatile memory 100. The control logic 150 may operate responsive to a control signal CTRL provided from the external device.

The control logic 150 may include a voltage generator 151. For example, the voltage generator 151 may be configured to generate a high voltage. In example embodiments, a voltage generated by the voltage generator 151 may be transferred to the word lines WL via the address decoder 120. When dummy word lines DWL (not shown) are additionally provided between the address decoder 120 and the memory cell array 110, a voltage generated by the voltage generator 151 may be transferred to the dummy word lines DWL. A voltage generated by the voltage generator 151 may be transferred to the memory cell array 110.

Figure 2:
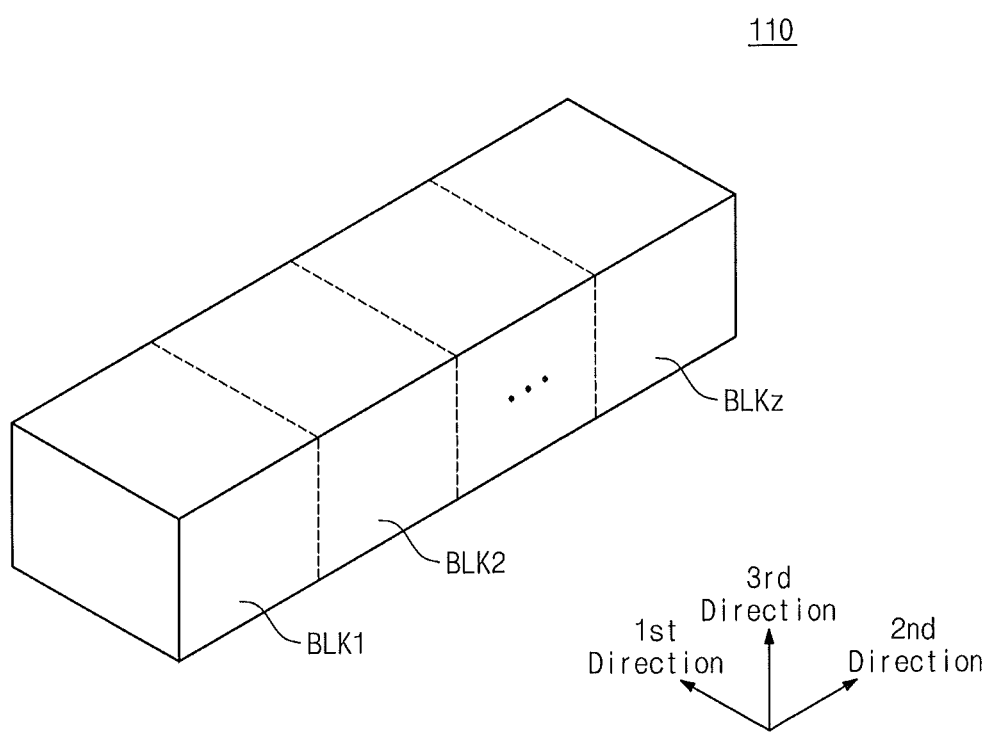
FIG. 2 is a block diagram schematically illustrating a memory cell array of FIG. 1.

FIG. 2 is a block diagram schematically illustrating an embodiment of the memory cell array 110 of FIG. 1. Referring to FIG. 2, the memory cell array 110 may include a plurality of memory blocks BLK1 to BLKz, each of which has a three-dimensional structure (or, a vertical structure). For example, each of the memory blocks BLK1 to BLKz may include structures extending along the first to third directions illustrated in FIG. 2.

In some embodiments, each memory block BLK1 through BLKz may include a plurality of NAND strings NS that extend along the second direction. The NAND strings NS may be spaced apart from one another along the first direction, and may be stacked along the third direction.

Each NAND string NS may be connected to a bit line BL, a string selection line SSL, a ground selection line GSL, word lines WL, and a common source line CSL. Each memory block may be connected to the plurality of bit lines BL, the plurality of string selection lines SSL, the plurality of ground selection lines GSL, the plurality of word lines WL, and the common source line CSL. The memory blocks BLK1 to BLKz according to some embodiments will be more fully described with reference to FIG. 3.

In example embodiments, the memory blocks BLK1 to BLKz may be selected by the address decoder 120 in FIG. 1. For example, the address decoder 120 may be configured to select a memory block, corresponding to a decoded row address, from among the memory blocks BLK1 to BLKz.

Figure 3:
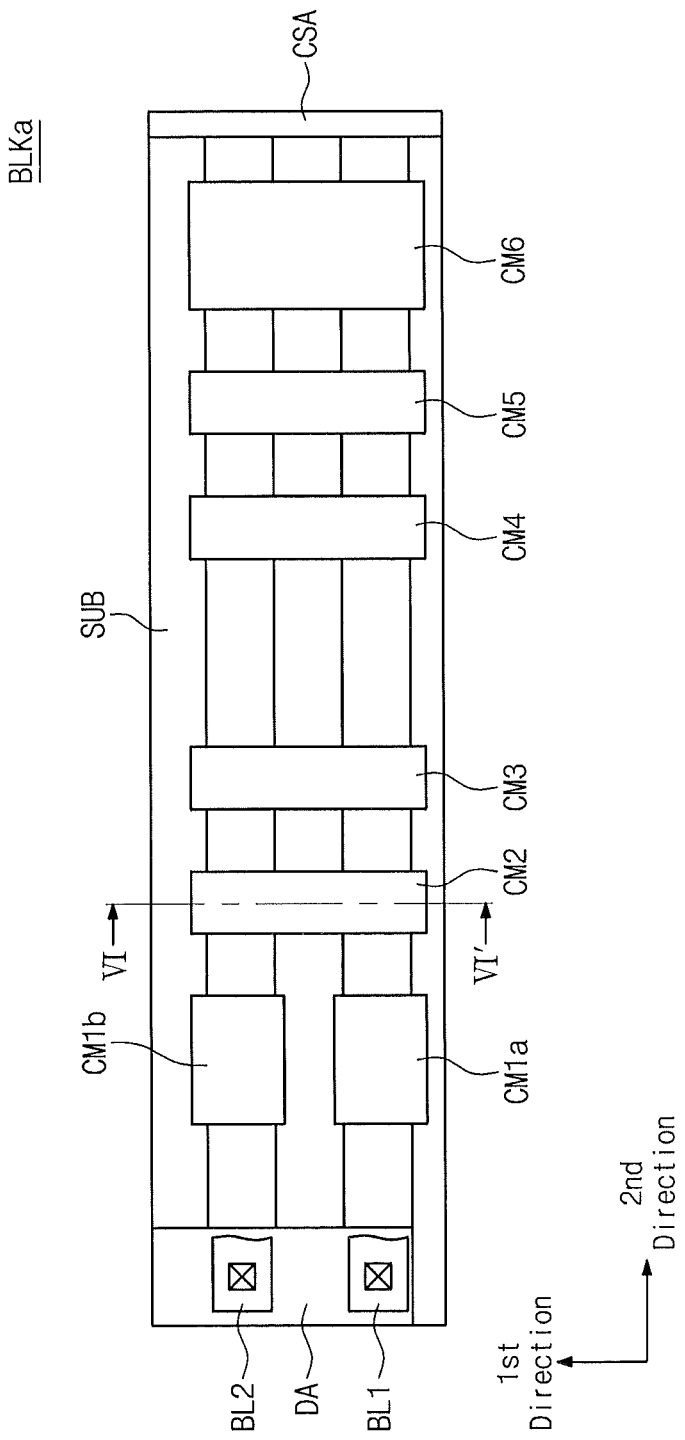
FIG. 3 is a plan view of a memory block BLKa according to an embodiment of the inventive concept.
Figure 4:
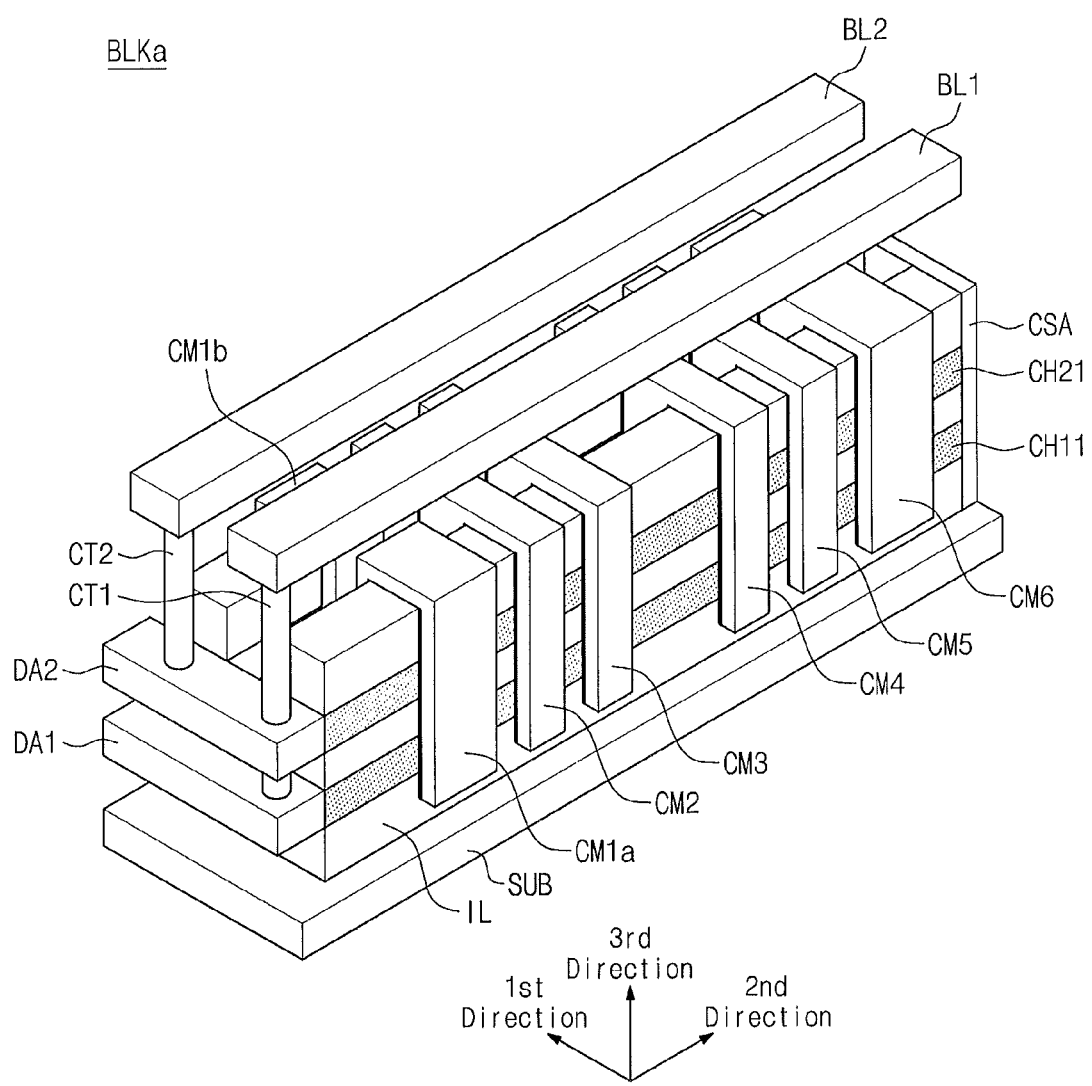
FIG. 4 is a perspective view of a memory block according to an embodiment of the inventive concept.
Figure 5:
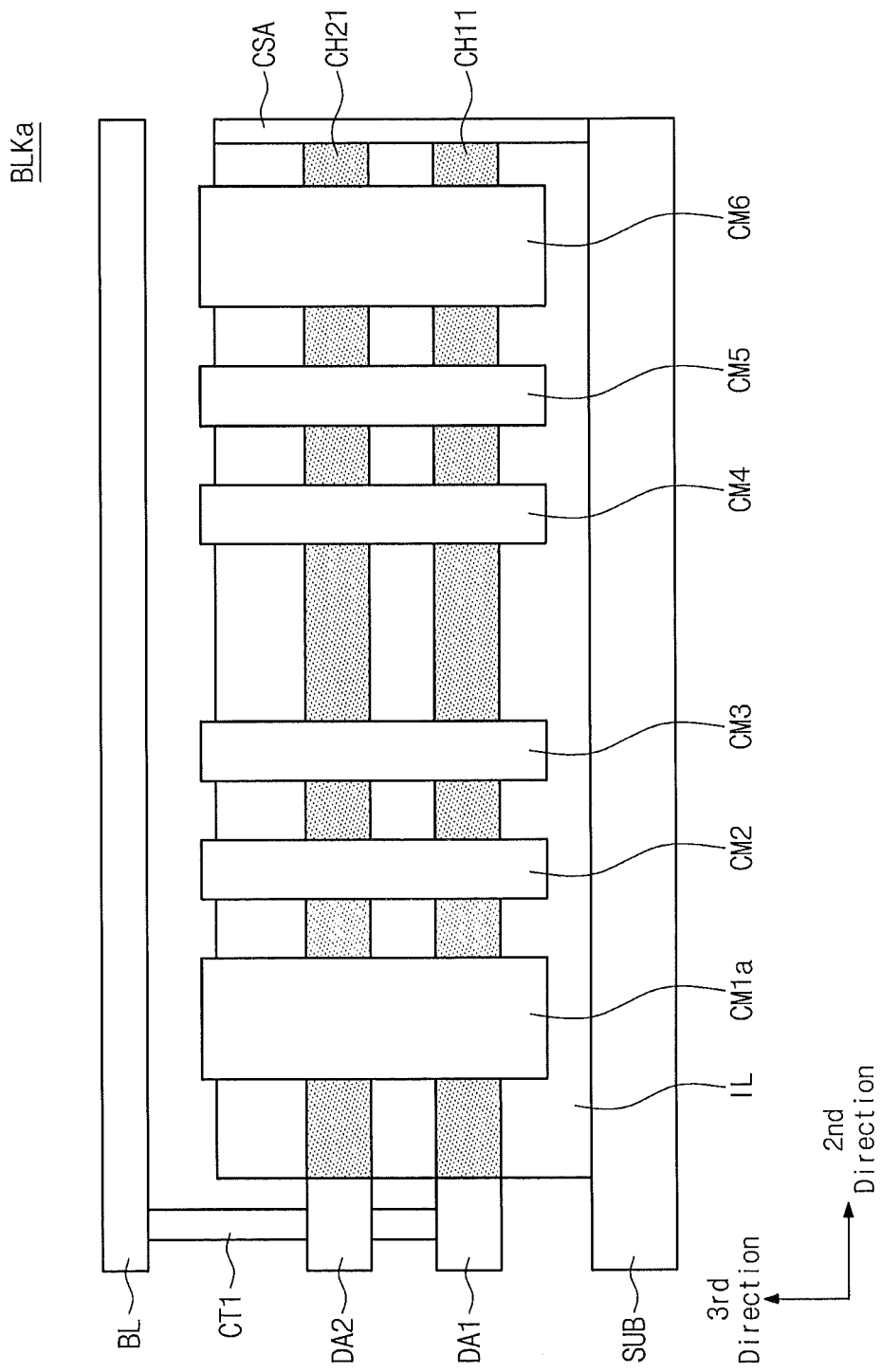
FIG. 5 is a lateral (side) view of a memory block according to an embodiment of the inventive concept.
Figure 6:
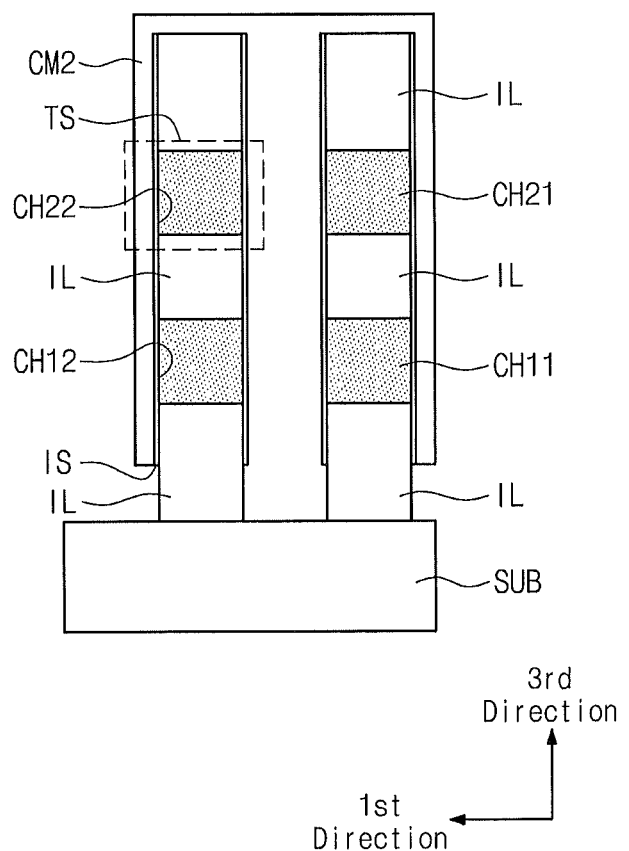
FIG. 6 is a cross-sectional view taken along a line VI-VI' of FIG. 3.

FIG. 3 is a plan view of a memory block BLKa according to an embodiment of the inventive concept. FIG. 4 is a perspective view of the memory block BLKa of FIG. 3. FIG. 5 is a lateral (side) view of the memory block of FIG. 3. FIG. 6 is a cross-sectional view taken along a line VI-VI' of FIG. 3.

Referring to FIGS. 3 to 6, a substrate SUB may be provided. The substrate SUB may be, for example, a P-type semiconductor material (e.g., silicon). The substrate SUB may include a P-well or a pocket P-well.

Channel films CH11, CH12, CH21, and CH22 and insulation films IL may be alternately stacked on the substrate SUB in a direction perpendicular to the substrate SUB to form a stacked structure. Exemplarily, a plurality of insulation films IL that extend longitudinally in a second direction (see FIG. 5) and are spaced apart along a first direction (see FIG. 6) may be provided on the substrate SUB. A plurality of channel films CH11 and CH12 that extend along the second direction (see FIG. 4) and are spaced apart along the first direction (see FIG. 6) may be provided on the insulation films IL. Another plurality of insulation films IL may be provided on top surfaces of the channel films CH11 and CH12, and the channel films CH21 and CH22 may be provided on these insulation films IL. Yet another plurality of insulation films IL may be provided on top surfaces of the channel films CH21 and CH22. The channel films CH11, CH12, CH21, and CH22 may include, for example, intrinsic semiconductor or P-type semiconductor (e.g., silicon).

In FIGS. 3 to 6, there is illustrated an example where three layers of insulation films IL are provided between two layers of channel films (the first layer of channel films including CH11 and CH12 and the second layer of channel films including CH21 and CH22). The number of channel films, the number of layers of channel films, the number of insulation films and the number of layers of insulation films is not limited to this disclosure. Exemplarily, the number of channel films and channel film layers can be changed and applied so far as an insulation film layer is provided between the substrate SUB and the first layer of channel films and another insulation film layer is provided on the channel film layer that is farthest from the substrate SUB.

First ends of the channel films CH11 and CH12 may be commonly connected to a drain area DA1. First ends of the channel films CH21 and CH22 may likewise be commonly connected to a drain area DA2. The drain areas DA1 and DA2 may include an N-type semiconductor material (e.g., silicon). Each of the drain areas DA1 and DA2 may be connected in common to channel films (CH11 and CH12) or (CH21 and CH22), placed at a corresponding layer, from among the channel films CH11, CH12, CH21, and CH22. The number of drain areas DA1 and DA2 may be based on the number of layers of channel films CH11, CH12; CH21, CH22.

The drain area DA1 may be connected to a bit line BL1 through a contact CT1. The drain area DA2 may be connected to a bit line BL2 through a contact CT2. The contact CT1 may be electrically insulated from the drain area DA2. Thus, the channel films CH11 and CH12 may be commonly connected to the bit line BL1 through the contact CT1, and the channel films CH21 and CH22 may be commonly connected to the bit line BL2 through the contact CT2. The bit lines BL1 and BL2 may be spaced apart from each other along the first direction and may extend longitudinally along the second direction. The bit lines BL1 and BL2 may include a conductive material such as a metallic material, poly silicon, or the like.

Each of the bit lines BL1 and BL2 may be connected in common to channel films (CH11 and CH12) or (CH21 and CH22), placed at a corresponding layer, from among the channel films CH11, CH12, CH21, and CH22. The number of bit lines BL1 and BL2 may be based on the number of layers of the channel films CH11, CH12; CH21, CH22.

The second ends of the channel films CH11, CH12, CH21, and CH22 may be commonly connected to a common source area CSA. The common source area CSA may include an N-type semiconductor material (e.g., silicon).

The channel films CH11 and CH21 and the insulation films IL that are disposed above and below the channel films CH11 and CH21 form a first stacked structure. The channel films CH12 and CH22 and the insulation films IL that are disposed above and below the channel films CH12 and CH22 form a second stacked structure.

Conductive materials CM1a, CM1b, and CM2 to CM6 may be provided on the channel films CH11, CH12, CH21, and CH22 and the insulation films IL. Thus, the conductive materials CM1a, CM1b, and CM2 to CM6 are provided on the above-described first and second stacked structures. The conductive material CM1a may extend from the top of the first stacked structure (i.e., channel films CH11, CH21 and corresponding insulation films IL) and along the sides of the stacked channel films CH11, CH21 and corresponding insulation films IL toward the substrate SUB. The conductive material CM1a may be spaced apart from the substrate SUB.

The conductive material CM1b may extend from the top of the second stacked structure (i.e., channel films CH12, CH22 and corresponding insulation films IL) and along the sides of the stacked channel films CH12, CH22 and corresponding insulation films IL toward the substrate SUB in a direction perpendicular to the substrate SUB. The conductive material CM1b may also be spaced apart from the substrate SUB.

The conductive materials CM1a and CM1b may be spaced apart from each other. Each of the conductive materials CM1a and CM1b may be commonly connected to corresponding channel films (CH11 and CH21) or (CH12 and CH22), placed at the same location along the first direction, from among the channel films CH11, CH12, CH21, and CH22. The number of conductive materials CM1a and CM1b may be based on the number of channel films provided along the first direction.

The conductive materials CM2 to CM6 may also be provided on the channel films CH11, CH12, CH21, and CH22 and the insulation films IL. The conductive materials CM2 to CM6 may be spaced apart along the second direction and may be spaced apart from the conductive materials CM1a and CM1b along the second direction. The conductive materials CM2 to CM6 may extend along the top of the topmost insulation films IL and toward the substrate SUB in a direction perpendicular to the substrate SUB along sides of the channel films CH11, CH12, CH21, and CH22 and the insulation films IL. The conductive materials CM2 to CM6 may be spaced apart from the substrate SUB.

In example embodiments, at least one conductive material CM1a/CM1b, that is closest to the drain areas DA1 and DA2, from among the conductive materials CM1a, CM1b, and CM2 to CM6, and at least one conductive material CM6 that is closest to the common source area CSA may have widths (i.e., the distance that the conductive materials extend along the second direction) that are wider than those of the remaining conductive materials CM2 to CM5.

In example embodiments, in the conductive materials CM2 to CM5 having the smaller widths, the interval between the conductive materials CM3 and CM4 along the second direction may be wider than the corresponding interval between the conductive materials CM2 and CM3 or the corresponding interval between the conductive materials CM4 and CM5.

The conductive materials CM1a, CM1b, and CM2 to CM6 may include conductive materials such as a metallic material, poly silicon, and the like.

In FIGS. 3 to 6, there is illustrated an example where the number of conductive materials CM1a, CM1b, and CM2 to CM6 provided along the second direction is six. However, the inventive concept is not limited thereto. More or fewer conductive materials may be provided.

Information storage films IS may be provided between the conductive materials CM1a, CM1b, and CM2 to CM6 and the channel films CH11, CH12, CH21, and CH22. The information storage films IS may trap or accumulate charges.

As shown in FIG. 6, a channel film CH, an information storage film IS adjacent to the channel film CH, and a conductive material CM may form a transistor structure TS.

Figure 7:
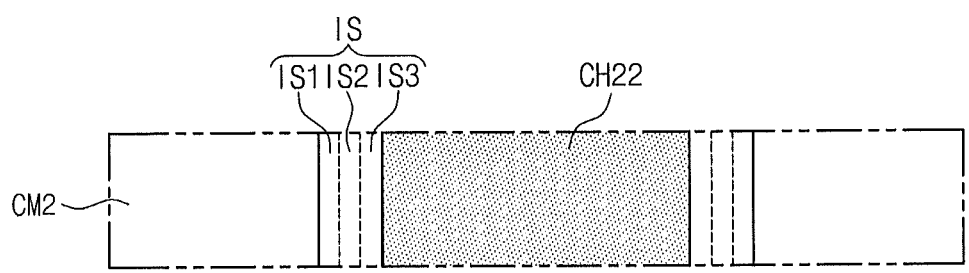
FIG. 7 is an enlarged view of a transistor structure of FIG. 6.

FIG. 7 is an expanded view of a transistor structure TS of FIG. 6. Referring to FIGS. 6 and 7, an information storage film IS provided between a conductive material CM2 and a channel film CH22. The information storage film IS may include a plurality of films. For example, the information storage film IS may include a blocking film IS1, a charge storage film IS2, and a tunneling film IS3.

The blocking film IS1 may comprise a blocking insulation film. The blocking film IS1 may include an aluminum oxide film, a hafnium oxide film, and so on.

The charge storage film IS2 may comprise a charge trap film or a charge accumulation film. The charge storage film IS2 may include a nitride film or a metallic oxide film (e.g., an aluminum oxide film, a hafnium oxide film, etc.).

The tunneling film IS3 may comprise a tunneling insulation film. The tunneling film IS3 may include a thermal oxide film.

The information storage film IS may include ONO (Oxide-Nitride-Oxide) or ONA (Oxide-Nitride-Aluminum).

The conductive material CM2 may form a control gate. The channel film CH22 may form a channel.

A transistor structure TS including the conductive material CM2, the blocking film IS1, the charge storage film IS2, the tunneling film IS3, and the channel film CH22 may form a memory cell transistor. That is, a memory block BLKa may be a three-dimensional memory block which includes a plurality of memory cell transistors stacked on a substrate SUB in a direction perpendicular to the substrate SUB.

Figure 8:
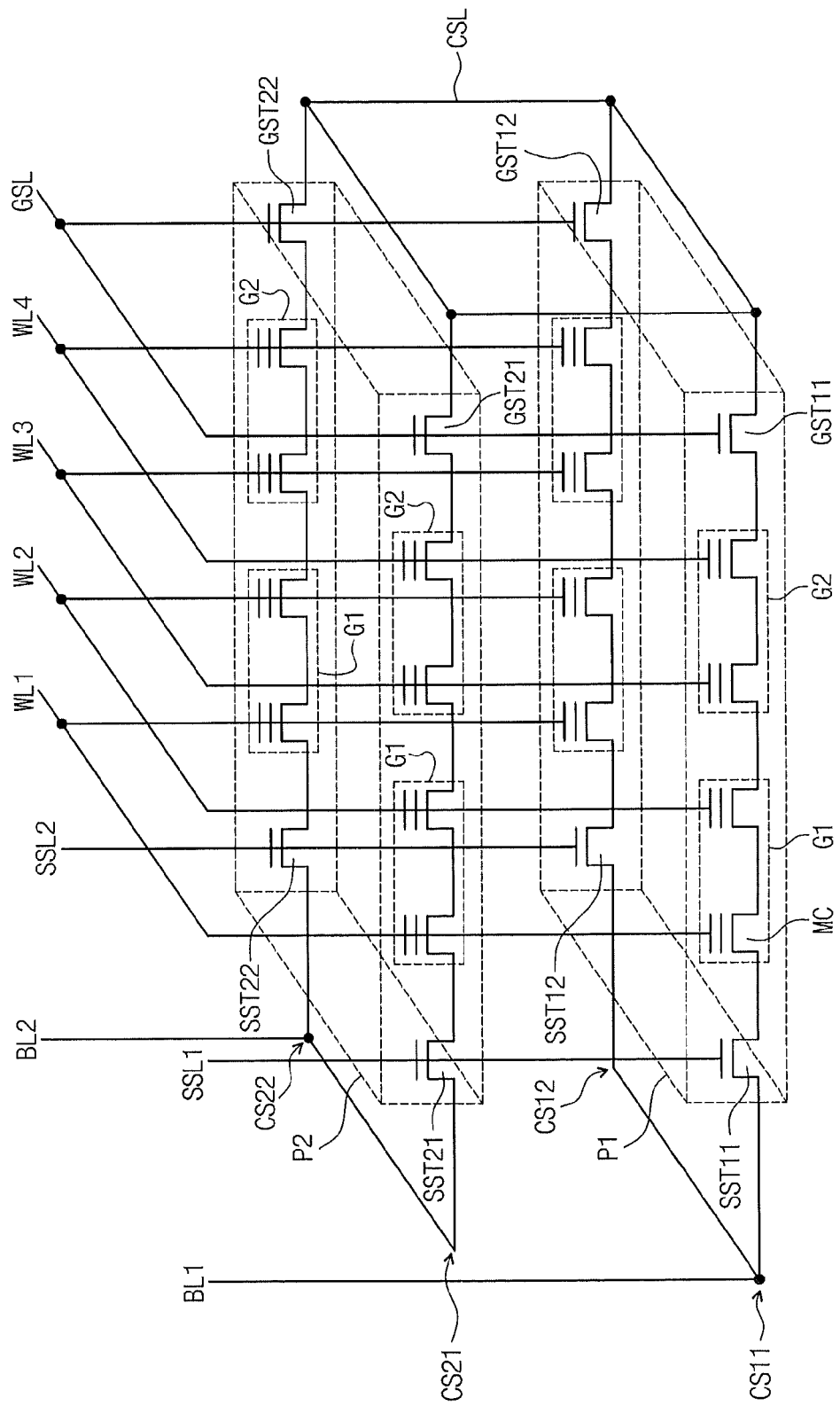
FIG. 8 is an equivalent circuit diagram of a memory block described with reference to FIGS. 3 to 7.

FIG. 8 is an equivalent circuit diagram of the memory block BLKa described with reference to FIGS. 3 to 7. Referring to FIGS. 3 to 8, a channel film CH11 may form a cell string CS11 with information storage films IS and conductive materials CM1a and CM2 to CM6. A channel film CH12 may form a cell string CS12 with the information storage films IS and conductive materials CM1b and CM2 to CM6. A channel film CH21 may form a cell string CS21 with the information storage films IS and the conductive materials CM1a and CM2 to CM6. A channel film CH22 may form a cell string CS22 with the information storage films IS and the conductive materials CM1b and CM2 to CM6.

The cell strings CS11 and CS12, that is, channel films CH11 and CH12 may lie in a first plane P1. The cell strings CS21 and CS22, that is, channel films CH21 and CH22 may lie in a second plane P2. The first and second planes P1 and P2 may be parallel to each other and to the substrate SUB and may be spaced apart from each other and from the substrate SUB.

The conductive material CM1a may be commonly connected to the channel films CH11 and CH21, and may form string selection transistors SST11 and SST21 and a string selection line SSL1. The conductive material CM1b may be commonly connected to the channel films CH12 and CH22 to form string selection transistors SST12 and SST22 and a string selection line SSL2. The conductive material CM2 may be commonly connected to the channel films CH11, CH12, CH21, and CH22 to form memory cell transistors MC and a word line WL1. The conductive material CM3 may be commonly connected to the channel films CH11, CH12, CH21, and CH22 to form memory cell transistors MC and a word line WL2. The conductive material CM4 may be commonly connected to the channel films CH11, CH12, CH21, and CH22 to form memory cell transistors MC and a word line WL3. The conductive material CM5 may be commonly connected to the channel films CH11, CH12, CH21, and CH22 to form memory cell transistors MC and a word line WL4. The conductive material CM6 may be commonly connected to the channel films CH11, CH12, CH21, and CH22 to form ground selection transistors GST11, GST12, GST21, and GST22 and a ground selection line GSL.

A common source area CSA may be connected in common to the channel films CH11, CH12, CH21, and CH22 to form a common source line CSL.

A bit line BL1 may be commonly connected to the channel films CH11 and CH12 (i.e., cell strings CS11 and CS12) through a drain area DA1. A bit line BL2 may be commonly connected to the channel films CH21 and CH22 (i.e., cell strings CS21 and CS22) through a drain area DA2.

Exemplarily, the conductive materials CM1a and CM1b forming the string selection lines SSL1 and SSL2 and the string selection transistors SST11, SST12, SST21, and SST22 and the conductive material CM6 forming the ground selection transistors GST11, GST12, GST21, and GST22 and the ground selection line GSL may have widths wider than those of conductive materials CM2 to CM5 forming the word lines WL1 to WL4 and the memory cell transistors MC.

Exemplarily, at least two or more conductive materials of the conductive materials CM1a, CM1b, and CM2 to CM6 may form at least two or more string selection lines or at least two or more ground selection lines.

Memory cell transistors MC connected to the word lines WL1 and WL2 may form a first group G1. Memory cell transistors MC connected to the word lines WL3 and WL4 may form a second group G2. The first and second groups G1 and G2 may be erased independently from each other. For example, when memory cell transistors in the first group G1 are erased, memory cell transistors in the second group G2 may not be erased.

Compared with a planar-type nonvolatile memory, a three-dimensional nonvolatile memory may have more memory cell transistors connected to a common word line. For example, in the planar-type nonvolatile memory, a plane of memory cell transistors formed on a substrate may be connected in common to a word line. On the other hand, as illustrated in FIGS. 3 to 8, in the three-dimensional nonvolatile memory, memory cell transistors formed at a plurality of planes P1 and P2 may be connected in common to a word line.

In the three-dimensional nonvolatile memory which performs an erase operation by a block unit, an increase in the number of memory cell transistors connected to a word line may cause a decrease in the operating speed of the device. For example, a flash memory may have an erase-before-write characteristic. Due to the erase-before-write characteristic, the flash memory may invalidated data that is deleted by a host rather than immediately erasing such data. In such devices, the flash memory may perform an erase operation by copying valid data in a memory block to another memory block and erasing an original memory block. Copying of valid data may be merge or garbage collection.

The greater the number of memory cell transistors, the greater the amount of data that must be copied by merge or garbage collection. That is, as the number of memory cell transistors increases, the time required to perform merge or garbage collection may increase. Consequently, the operating speed of the device may decrease.

With an embodiment of the inventive concept, a memory block BLKa may be divided into two or more groups of memory cells which are erased independently. Thus, a time taken to perform merge or garbage collection may decrease. This may improve the operating speed of the device.

Figure 9:
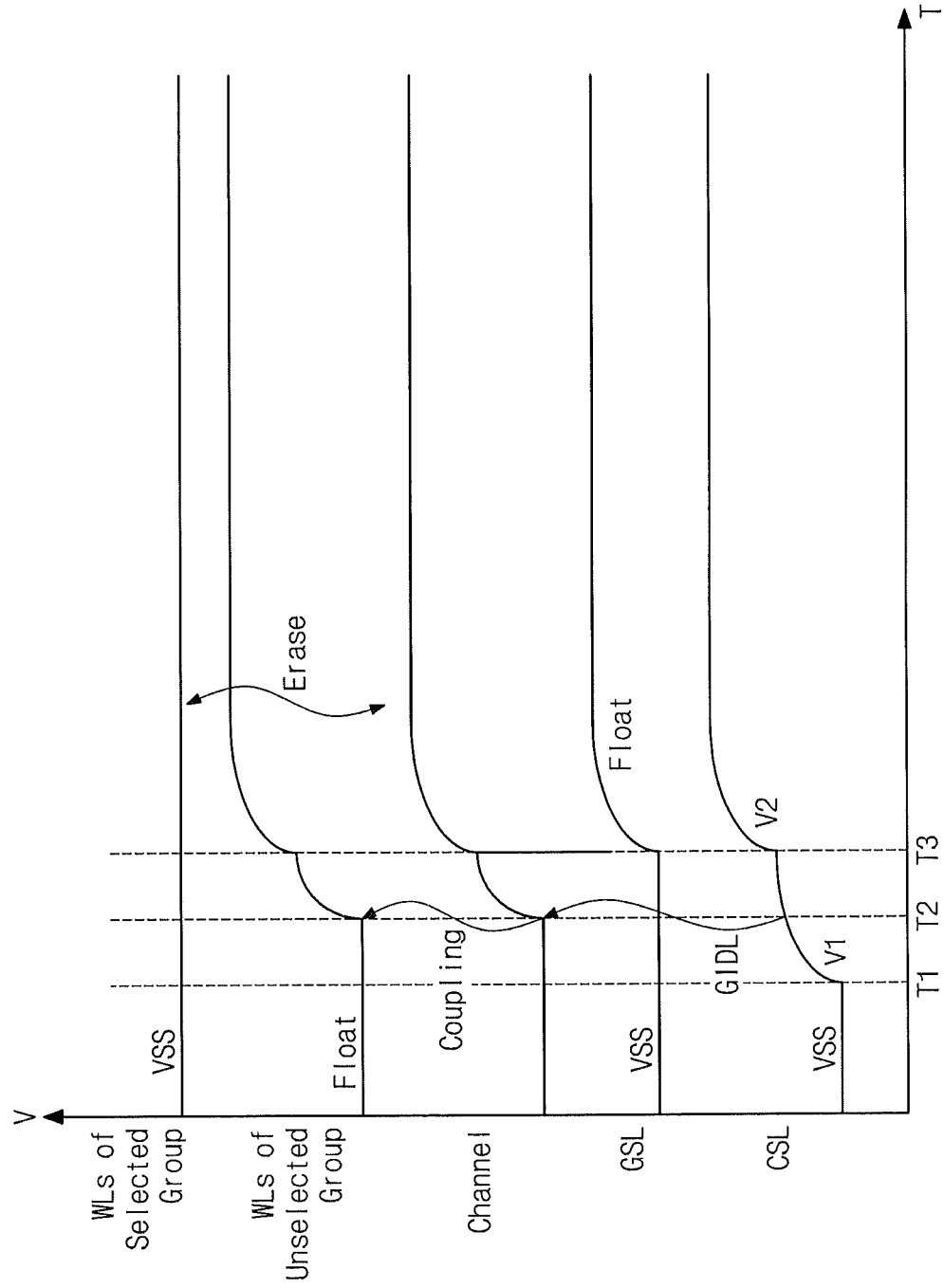
FIG. 9 is a timing diagram schematically illustrating an erase operation of a memory block described with reference to FIGS. 3 to 8.

FIG. 9 is a timing diagram schematically illustrating an erase operation of the memory block BLKa described with reference to FIGS. 3 to 8. In FIG. 9, a horizontal axis may indicate a time T, and a vertical axis may indicate a voltage V.

Referring to FIGS. 3 to 9, during an erase operation, one of the first and second groups G1 and G2 of memory cell transistors MC of memory block BLKa may be selected, and the other group may not be selected. A ground voltage VSS may be applied to word lines in the selected group. Word lines in the unselected group may be floated.

At time T1, a first voltage V1 may be supplied to the common source line CSL. Exemplarily, the first voltage V1 may be supplied to a common source area CSA from a separate contact connected to the common source area CSA or from a substrate SUB.

At time T2, a ground selection line GSL may maintain the ground voltage VSS. GIDL (Gate Induced Drain Leakage) may be generated at ground selection transistors GST11, GST12, GST21, and GST22 by a voltage difference between the ground voltage GSL of the ground selection line GSL and the voltage of the common source line CSL (as voltage V1 is supplied to the common source line CSL). If the GIDL is generated, thermal electrons and holes may be generated at an area where the common source line CSL connects to the ground selection transistors GST11, GST12, GST21, and GST22. The thermal electrons may be injected into the common source area CSA, and the holes may be injected into channels CH11, CH12, CH21, and CH22. That is, a current may flow from the common source area CSA to the channels CH11, CH12, CH21, and CH22.

At time T1, a current may flow from the common source area CSA to the channels CH11, CH12, CH21, and CH22 via GIDL. This current may increase the voltages of the channels CH11, CH12, CH21, and CH22.

The word lines in the selected group may maintain the ground voltage VSS while voltages of the channels CH11, CH12, CH21, and CH22 increase. On the other hand, word lines in the unselected group may be at a floating state. Thus, when voltages of the channels CH11, CH12, CH21, and CH22 increase by coupling, voltages of the word lines in the unselected group may also increase.

At time T3, the ground selection line GSL may be floated, and a second voltage V2 may be applied to the common source line CSL. When the second voltage V2 is applied to the common source line CSL, voltages of the channels CH11, CH12, CH21, and CH22 may also increase. As voltages of the channels CH11, CH12, CH21, and CH22 increase, memory cell transistors in the selected group may be erased. For example, the memory cell transistors in the selected group may be erased by the Fowler-Nordheim tunneling generated by a voltage difference between voltages of the channels CH11, CH12, CH21, and CH22 and the ground voltage VSS applied to the word lines of the selected group.

Voltages of word lines in the unselected group may increase by the coupling. Thus, memory cell transistors in the unselected group may not be erased.

Since the ground selection line GSL is floated, its voltage may also increase by the coupling. Thus, the ground selection transistors GST11, GST12, GST21, and GST2 may not be erased.

Exemplarily, string selection lines SSL1 and SSL2 may be floated from the beginning or floated at a point of time when the ground selection line GSL is floated.

Exemplarily, the coupling may be generated between memory cell transistors in the first group G1 and memory cell transistors in the second group G2. Voltages of word lines in a group that is not erased may not increase sufficiently by voltages of word lines in a group erased. Likewise, voltages of word lines in a group erased may increase by voltages of word lines in a group not erased. In this case, an erase disturbance may be generated so that memory cell transistors that are erase inhibited are erased and memory cell transistors that are to be erased are not erased.

With an embodiment of the inventive concept, a distance between the first group G1 and the second group G2 may be set to be longer than a conventional distance. Herein, a "distance" between a first group of conductive materials and a second group of conductive materials refers to the shortest distance between the conductive material in the first group that is closest to the conductive materials in the second group and the conductive material in the second group that is closest to the conductive materials in the first group. Thus, in the embodiment of FIGS. 3-6, the "distance" between the first group G1 and the second group G2 would be the shortest distance between conductive material CM3 and conductive material CM4. As show in, for example, FIG. 4, the distance between conductive materials CM3 and CM4 (which is the region of the device that defines the boundary between the first and second groups G1 and G2) may be longer than a distance between conductive materials CM1 and CM2 or a distance between CM4 and CM5 in each group. In other words, the distance between adjacent ones of the conductive materials CM1 to CM6 that are within each group may be smaller than the distance between the conductive materials CM1 to CM6 of two different groups that are closest to each other. Thus, the coupling between the first and second groups G1 and G2 may be reduced. This may reduce or prevent the above-described erase disturbance.

Figure 10:
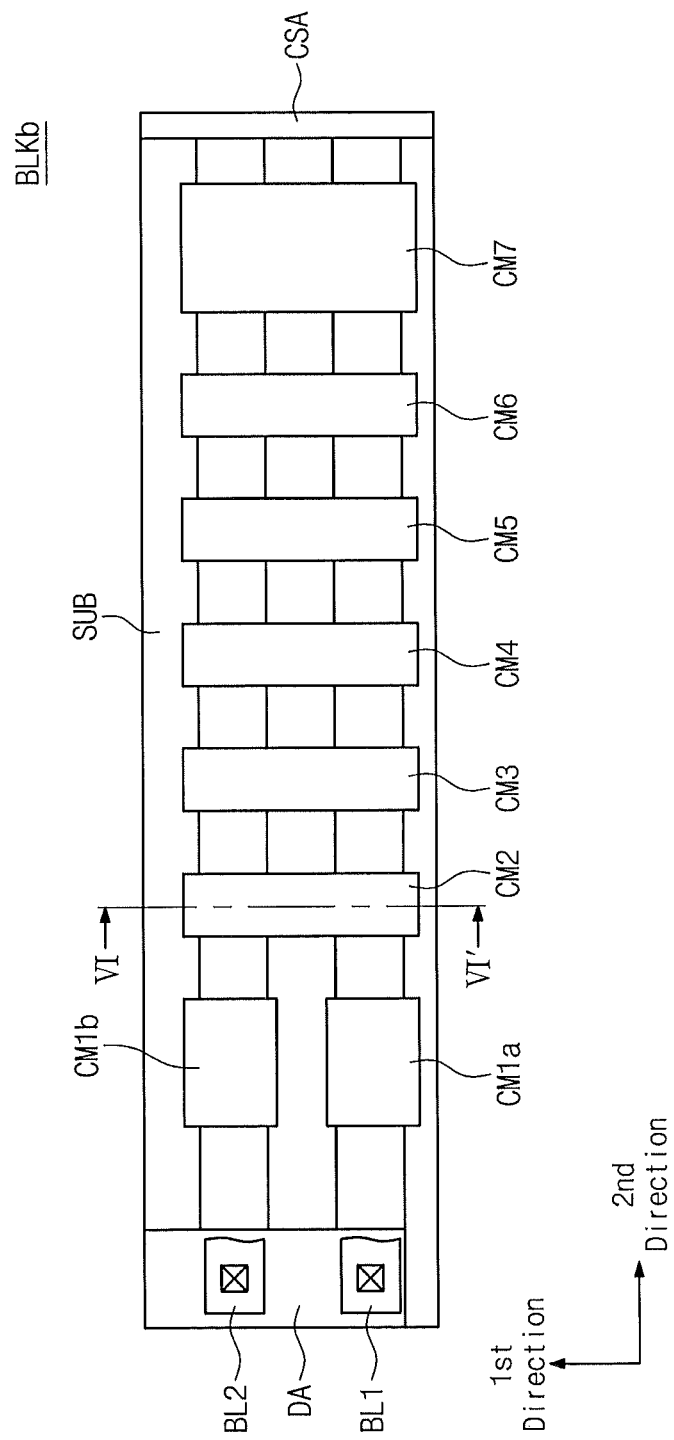
FIG. 10 is a plan view of a memory block according to another embodiment of the inventive concept.
Figure 11:
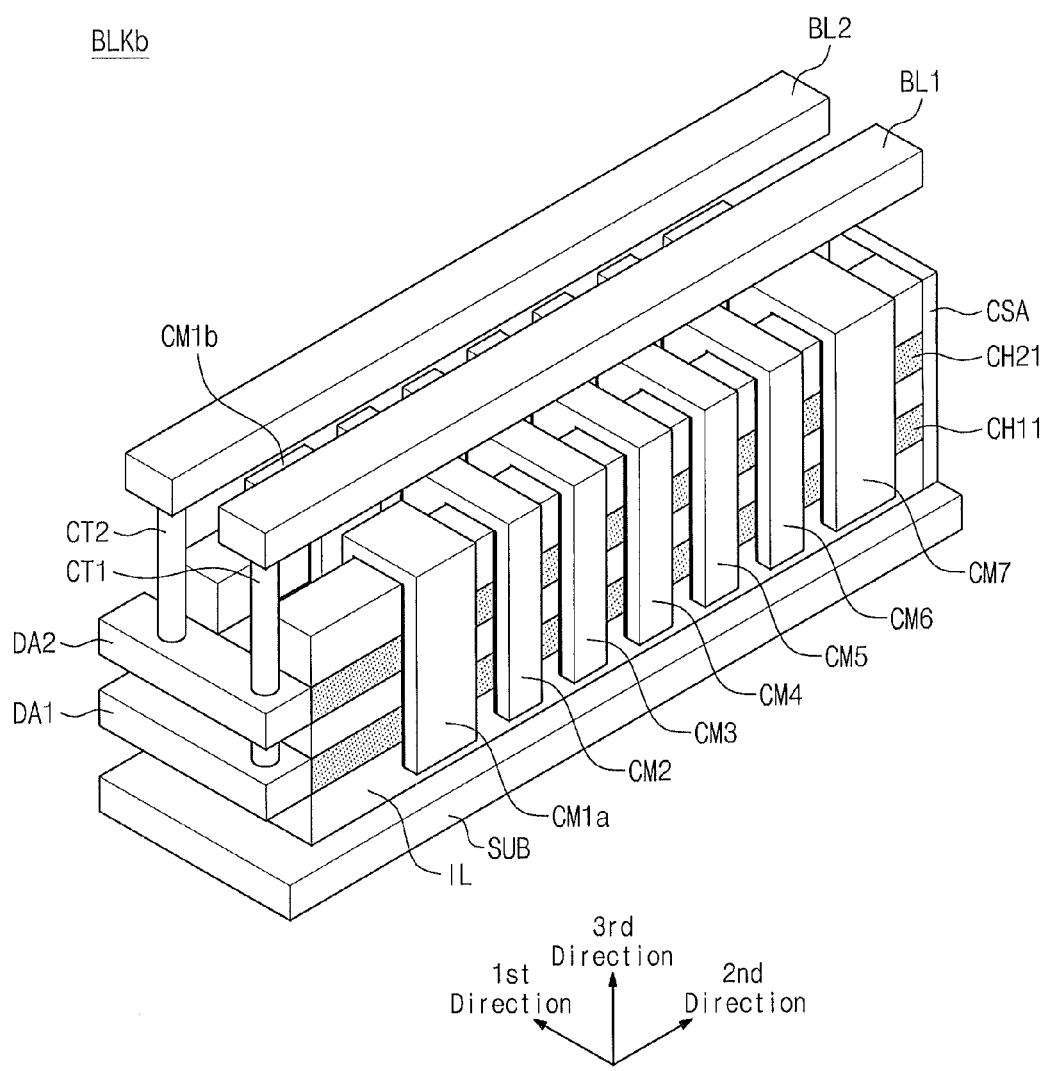
FIG. 11 is a perspective view of a memory block according to another embodiment of the inventive concept.
Figure 12:
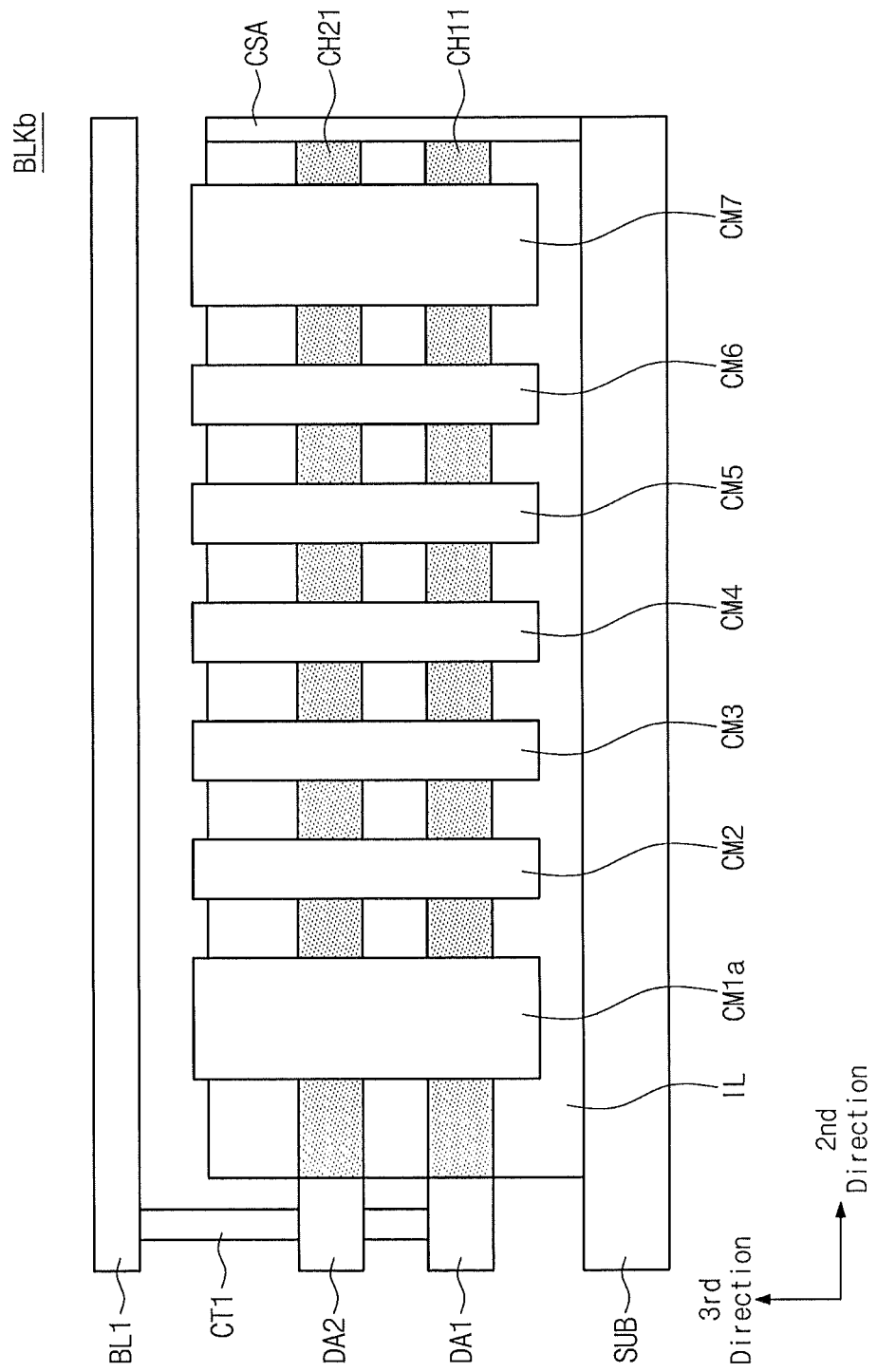
FIG. 12 is a first-direction lateral view of a memory block according to another embodiment of the inventive concept.

FIG. 10 is a plan view of a memory block BLKb according to another embodiment of the inventive concept. FIG. 11 is a perspective view of the memory block BLKb of FIG. 10, FIG. 12 is a first-direction lateral (side) view of the memory block BLKb of FIG. 10. A cross-sectional view of the memory block BLKb may be the same as the cross-sectional view of FIG. 6 that is discussed above, and a description thereof is thus omitted.

Compared to the memory block BLKa that is described above with reference to FIGS. 3 to 6, in memory block BLKb, conductive materials CM1a, CM1b, and CM2 to CM7 may be provided. The conductive materials CM2 to CM7 may be disposed along a second direction and may be spaced apart by the same interval.

Figure 13:
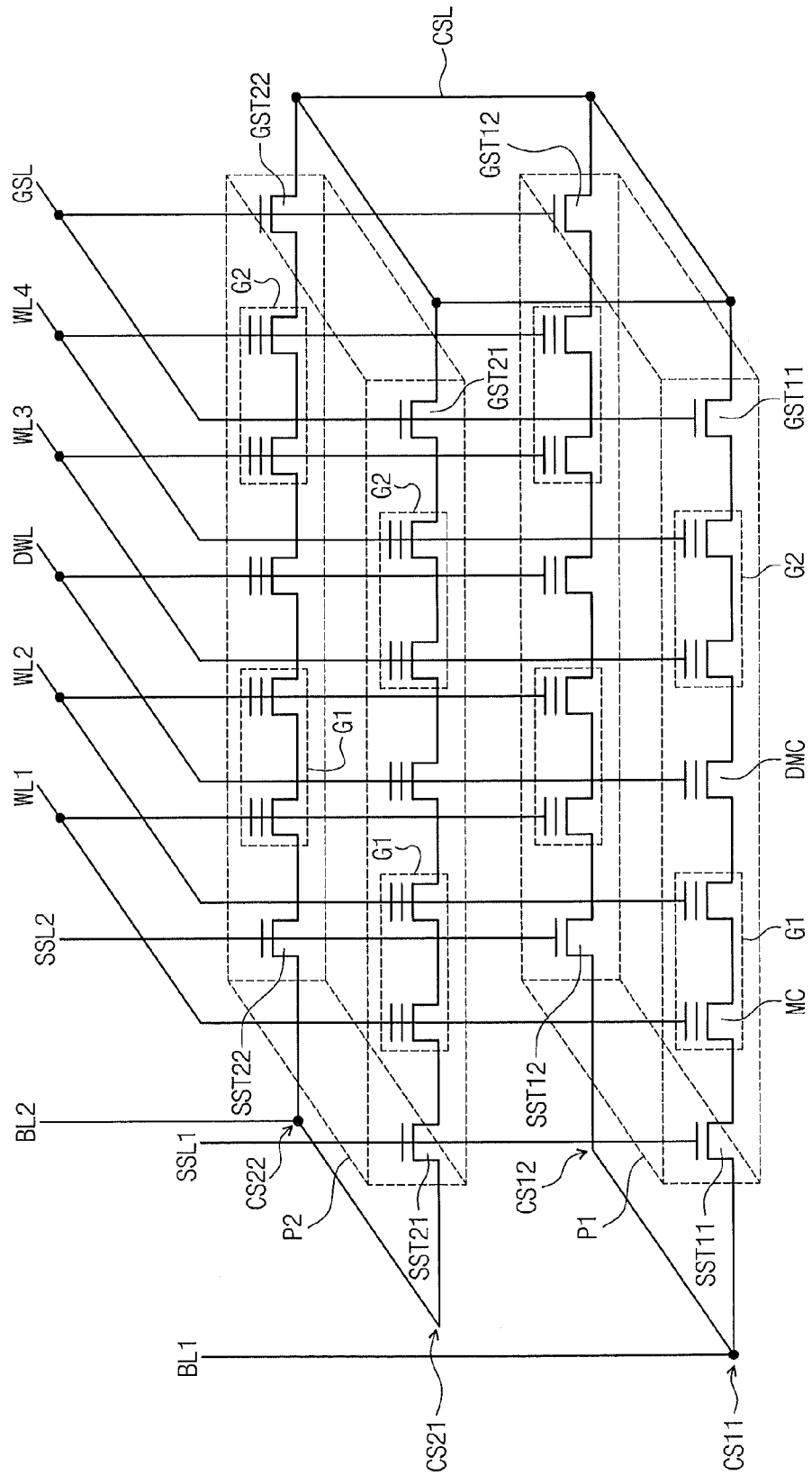
FIG. 13 is an equivalent circuit diagram of a memory block described with reference to FIGS. 10 to 12.

FIG. 13 is an equivalent circuit diagram of the memory block BLKb of FIGS. 10 to 12. As shown in FIG. 13, the circuit is similar to the equivalent circuit diagram for memory block BLKa that is shown in FIG. 8, except that in FIG. 13 dummy cell transistors DMC are provided between memory cell transistors in a first group G1 and memory cell transistors in a second group G2. The dummy cell transistors DMC may be connected in common to a dummy word line DWL.

Exemplarily, the conductive materials CM2 and CM3 may form word lines WL1 and WL2 and memory cell transistors MC corresponding to the word lines WL1 and WL2, and the conductive materials CM5 and CM6 may form word lines WL3 and WL4 and memory cell transistors MC corresponding to the word lines WL3 and WL4. The conductive material CM4 may form a dummy word line DWL and dummy memory cells DMC.

Compared to the memory block BLKa described above with reference to FIGS. 3 to 8, conductive materials CM2 to CM6 of a memory block BLKb may be spaced apart by the same interval. The conductive material CM4, placed between the first and second groups G1 and G2, from among the conductive materials CM2 to CM6 may form a dummy word line DWL and dummy cell transistors DMC. When memory cell transistors in the first and second groups G1 and G2 are erased independently, the dummy word line DWL and the dummy cell transistors DMC may reduce the coupling between the first and second groups G1 and G2 because the dummy word line DWL and the dummy cell transistors DMC increase the distance between the first and second groups G1 and G2.

Exemplarily, an intermediate voltage having a level between voltages of word lines of an unselected group and voltages of word lines of a selected group may be applied to the dummy word line DWL. When such an intermediate voltage is applied to the dummy word line DWL, the dummy cell transistors DMC may not be erased and the coupling between the first and second groups G1 and G2 may be reduced.

As described above, a memory block may be divided into a plurality of groups. The groups may be erased independently. When an erase operation is performed, an erase count may be managed. The erase count may indicate an erase frequency on memory cells. Exemplarily, the erase count may be managed by units of groups in a memory block. Erase counts of groups may be managed independently. In other example embodiments, the erase count may be managed by a memory block unit. Erase counts of memory blocks may be managed independently. When a group in each memory block is erased, an erase count of a memory block including the erased group may increase.

Figure 14:
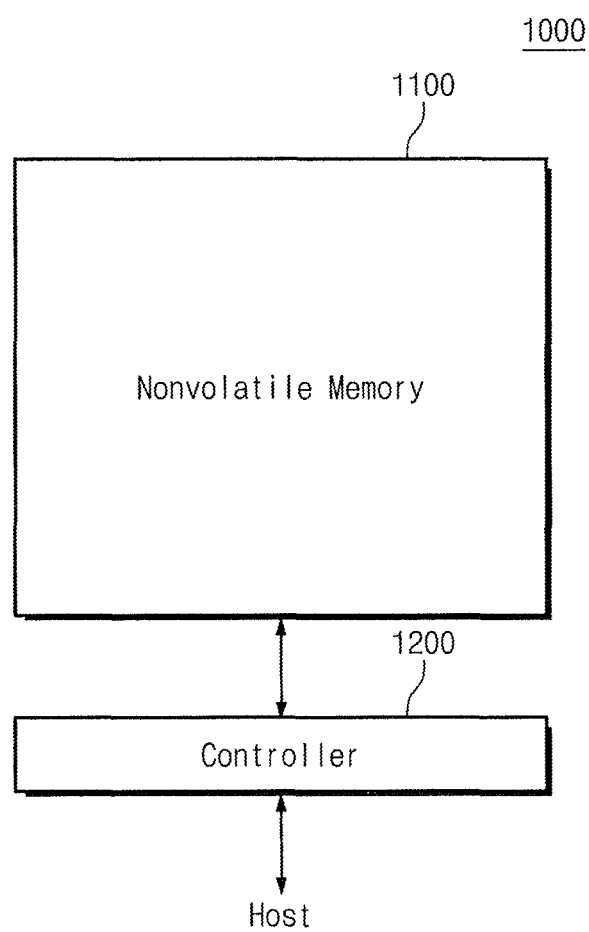
FIG. 14 is a block diagram schematically illustrating a memory system according to an embodiment of the inventive concept.

FIG. 14 is a block diagram schematically illustrating a memory system 1000 according to an embodiment of the inventive concept. Referring to FIG. 14, the memory system 1000 may include a nonvolatile memory 1100 and a controller 1200.

The nonvolatile memory 1100 may be configured to store data. The nonvolatile memory 1100 may be the nonvolatile memory of FIGS. 1 and 2. The nonvolatile memory 1100 may include, for example, the memory block BLKa that is described above with reference to FIGS. 3 to 8 or the memory block BLKb that is described above with reference to FIGS. 10 to 13.

The controller 1200 may be connected to a host and the nonvolatile memory device 1100. In response to a request from the host, the controller 1200 may be configured to access the nonvolatile memory device 1100. For example, the controller 1200 may be configured to control a read operation, a write operation, an erase operation, and a background operation of the nonvolatile memory device 1100. The controller 1200 may be configured to provide an interface between the nonvolatile memory device 1100 and the host. The controller 1200 may be configured to drive firmware for controlling the nonvolatile memory device 1100.

The controller 1200 may communicate with an external host. For example, the controller 1200 may be configured to communicate with an external host through at least one of various protocols such as an USB (Universal Serial Bus) protocol, an MMC (multimedia card) protocol, a PCI (peripheral component interconnection) protocol, a PCI-E (PCI-express) protocol, an ATA (Advanced Technology Attachment) protocol, a Serial-ATA protocol, a Parallel-ATA protocol, a SCSI (small computer small interface) protocol, an ESDI (enhanced small disk interface) protocol, an IDE (Integrated Drive Electronics) protocol, and so on.

Although not shown in FIG. 14, an error correction block may include an error correcting code (ECC). The error correction block may detect and correct an error of data read from the nonvolatile memory 1100 using the ECC.

The controller 1200 and the nonvolatile memory device 1100 may be integrated together. For example, the controller 1200 and the nonvolatile memory device 1100 may be integrated to provide a memory card. In some embodiments, the controller 1200 and the nonvolatile memory device 1100 may be integrated together to provide a memory card such as a PC (or, PCMCIA) card, a Compact Flash (CF) card, a SmartMedia (SM) card, a memory stick, a multimedia card (MMC, RS-MMC, MMCmicro), an SD card (SD, miniSD, SDHC), a Universal Flash Storage (UFS) device, or the like.

In other embodiments, the controller 1200 and the nonvolatile memory device 1100 may be integrated together to provide a Solid State Drive (SSD). The SSD may include a storage device which is configured to store data using semiconductor memories. In case that the memory system 1000 is used as the SSD, an operating speed of a host connected with the memory system 1000 may be remarkably improved.

In example embodiments, the memory system 1000 may be used in a computer, a portable computer, an Ultra Mobile PC (UMPC), a workstation, a net-book, a PDA, a web tablet, a wireless phone, a mobile phone, a smart phone, an e-book, a PMP (portable multimedia player), a digital camera, a digital audio recorder/player, a digital picture/video recorder/player, a portable game machine, a navigation system, a black box, a 3-dimensional television, a device capable of transmitting and receiving information at a wireless circumstance, one of various electronic devices constituting a home network, one of various electronic devices constituting a computer network, one of various electronic devices constituting a telematics network, RFID, or one of various electronic devices constituting a computing system.

In example embodiments, a nonvolatile memory device 1100 or a memory system 1000 may be packed by various types of packages such as PoP (Package on Package), Ball grid arrays (BGAs), Chip scale packages (CSPs), Plastic Leaded Chip Carrier (PLCC), Plastic Dual In-Line Package (PDI2P), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-Level Processed Stack Package (WSP), and the like.

Figure 15:
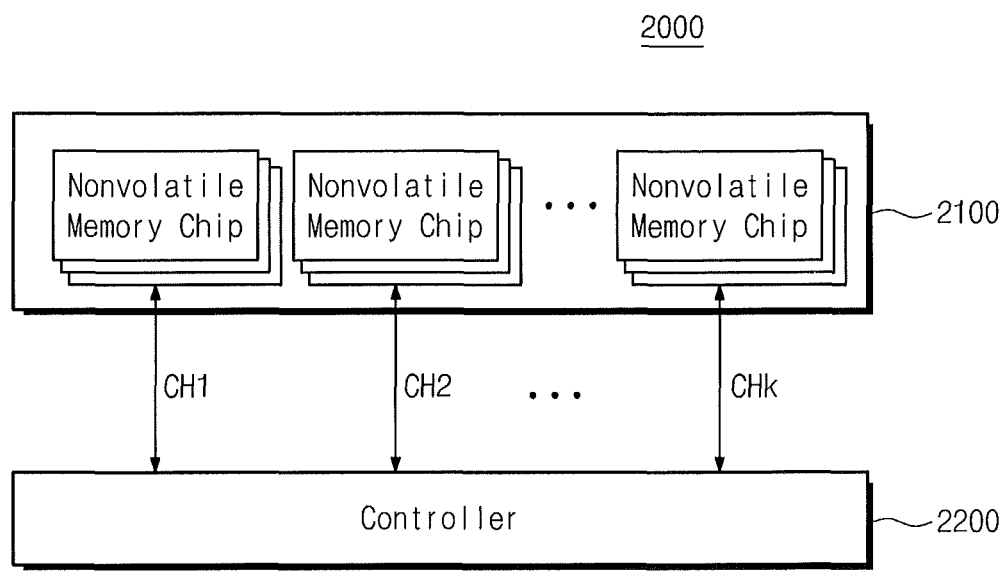
FIG. 15 is a block diagram illustrating an application of a memory system in FIG. 14.

FIG. 15 is a block diagram illustrating an application of the memory system of FIG. 14. Referring to FIG. 15, a memory system 2000 may include a nonvolatile memory 2100 and a controller 2200. The nonvolatile memory 2100 may include a plurality of nonvolatile memory chips, which form a plurality of groups. Nonvolatile memory chips in each group may be configured to communicate with the controller 2200 via one common channel. In example embodiments, the plurality of nonvolatile memory chips may communicate with the controller 2200 via a plurality of channels CH1 to CHk.

Each of the nonvolatile memory chips may have the structure of the memory device described above with reference to FIGS. 1 and 2. Each of the nonvolatile memory chips may include the memory block described above with reference to FIGS. 3 to 8 or the memory block described above with reference to FIGS. 10 to 13.

Figure 16:
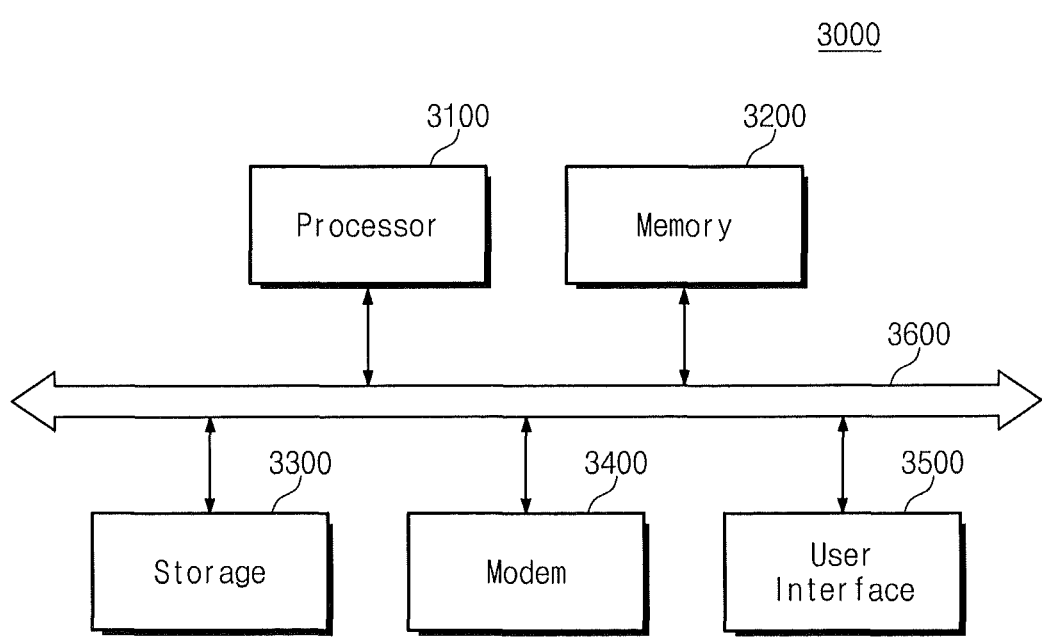
FIG. 16 is a block diagram schematically illustrating a computing system according to an embodiment of the inventive concept.

FIG. 16 is a block diagram schematically illustrating a computing system according to an embodiment of the inventive concept. Referring to FIG. 16, a computing system 3000 may include a processor 3100, a memory 3200, storage 3300, a modem 3400, a user interface 3500, and a system bus 3600.

The processor 3100 may control an overall operation of the computing system 3000 and perform a logical operation.

The memory 3200 may be a working memory. The memory 3200 may include a volatile or nonvolatile random access memory.

The storage 3300 may be main storage of the computing system 3000. The storage 3300 may be used to store data for a long time. The storage 3300 may include a nonvolatile memory, a hard disk drive, and so on.

The modem 3400 may perform wire or wireless communications with an external device.

The user interface 3500 may include user input interfaces such as a camera, a keyboard, a mouse, a microphone, a touch pad, a touch panel, a button, a sensor, and so on and user output interfaces such as a speaker, a monitor, an LCD device, an OLED display device, an AMOLED display device, a printer, a ramp, a motor, and so on.

The system bus 3600 may provide a communications channel that allows communications between the components of the computing system 3000.

A memory system 1000/2000 according to an embodiment of the inventive concept may be used to implement the memory 3200 or the storage 3300. In the event that the memory 3200 and the storage 3300 are formed of the same type of nonvolatile memories, they may be integrated in one memory.

While the inventive concept has been described with reference to exemplary embodiments, it will be apparent to those skilled in the art that various changes and modifications may be made without departing from the spirit and scope of the present invention. Therefore, it should be understood that the above embodiments are not limiting, but illustrative.

What is claimed is:

1. A nonvolatile memory, comprising:
a plurality of channel layers and a plurality of insulation layers alternately stacked on a substrate in a direction perpendicular to a major surface of the substrate, each of the plurality of channel layers including a plurality of channel films extending along a first direction, and each of the plurality of channel layers disposed in a respective one of a plurality of planes that are parallel to the major surface of the substrate;
a plurality of conductive materials that each extend downwardly from a top of the channel layers and the insulation layers in a direction perpendicular to the major surface of the substrate to at least partially cover at least one side surface of each channel film;
a plurality of information storage films provided between the channel films of the channel layers and the conductive materials; and
a plurality of bit lines connected to the channel layers, respectively,
wherein the conductive materials, the information storage films, and the channel films of the channel layers form a three-dimensional memory cell array,
wherein the conductive materials are arranged into at least first and second groups that are adjacent to each other, with each of the first and second groups including a plurality of adjacent ones of the conductive materials, and
wherein a distance between the first group and the second group is greater than a distance between adjacent conductive materials in the first group.

2. The nonvolatile memory of claim 1, wherein the conductive materials comprise word lines.

3. The nonvolatile memory of claim 1, wherein the nonvolatile memory device is configured to independently erase the first and second groups.

4. The nonvolatile memory of claim 1, wherein at an erase operation, a low voltage is applied to the conductive materials of the first group to erase memory cells associated with the conductive materials of the first group and the voltage applied to the conductive materials of the second group is floated.

5. The nonvolatile memory of claim 1, wherein at an erase operation, a low voltage is applied to conductive materials of the first group to erase memory cells associated with the conductive materials of the first group and a voltage higher than the low voltage and lower than a voltage that is supplied to the channel films is applied to the conductive materials of the second group so that memory cells associated with the conductive materials of the second group are not erased.

6. The nonvolatile memory of claim 1, wherein each channel film is electrically connected to a respective one of the plurality of bit lines through a respective one of a plurality of string selection transistors.

7. The nonvolatile memory of claim 1, further comprising:
a common source line connected to sides of the channel films that are opposite to the sides of the channels films that are connected to the bit lines.

8. The nonvolatile memory of claim 7, wherein the channel films are connected in common to the common source line through a plurality of ground selection transistors respectively.

9. The nonvolatile memory of claim 2, further comprising a dummy word line that is interposed between the conductive materials of the first group and the conductive materials of the second group.

10. A nonvolatile memory, comprising:
a plurality of channel layers and a plurality of insulation layers that are alternately stacked on a substrate in a direction perpendicular to a major surface of the substrate, each of the plurality of channel layers including a plurality of channel films, and each of the plurality of channel layers disposed in a respective one of a plurality of planes that are parallel to the major surface of the substrate;
a plurality of conductive materials that each extend downwardly from a top of the channel layers and the insulation layers in a direction perpendicular to the major surface of the substrate to at least partially cover at least one side surface of each channel film;
a plurality of information storage films provided between the channel films of the channel layers and the conductive materials; and
a plurality of bit lines connected to the channel layers, respectively,
wherein the conductive materials, the information storage films, and the channel films of the channel layers form a three-dimensional memory cell array,
wherein the conductive materials are arranged as a first group including two or more conductive materials, a second group including two or more other conductive materials, and a third group including at least another conductive material that is between the first group and the second group, and
wherein the nonvolatile memory is configured to erase the first group independent of the second group.

11. The nonvolatile memory of claim 10, wherein each conductive material in the first group and in the second group comprises a respective word line and the conductive material in the third group comprises a dummy word line.

12. The nonvolatile memory of claim 10, wherein the nonvolatile memory is configured so that the memory cells corresponding to the first group are erased when a low voltage is supplied to the conductive materials of the first group and the conductive materials of the second and third groups are floated.

13. The nonvolatile memory of claim 10, wherein the nonvolatile memory is configured so that the memory cells corresponding to the first group are erased when a low voltage is supplied to the conductive materials of the first group, the conductive materials of the third group are floated, and a voltage higher than the low voltage and lower than a voltage supplied to the channel films is applied to the conductive materials of the second group.

14. The nonvolatile memory of claim 10, wherein a first erase count corresponding to the first group increases when an erase operation on the first group is performed and a second erase count corresponding to the second group increases when an erase operation on the second group is performed.

15. The nonvolatile memory of claim 10, wherein an erase count corresponding to the first and second groups increases when an erase operation on the first group is performed, and
wherein the erase count corresponding to the first and second groups increases when an erase operation on the second group is performed.

16. A nonvolatile memory, comprising:
a stacked structure that includes a plurality of channel films and a plurality of insulation layers that are alternately stacked on a substrate in a direction perpendicular to a major surface of the substrate, wherein each of the plurality of channel films lies in a respective one of a plurality of planes that are parallel to the major surface of the substrate, and each of the plurality of channel films extending along a first direction;
a plurality of conductive materials that each extend from a top of the stacked structure and along at least one side surface of the stacked structure to at least partially cover a respective side surface of each of the plurality of channel films;
a plurality of information storage films provided between the channel films and the conductive materials; and
a plurality of bit lines that are electrically connected to respective ones of the channel films,
wherein the conductive materials, the information storage films, and the channel films are part of a three-dimensional memory cell array,
wherein the conductive materials are arranged into at least first and second groups that are adjacent to each other, with each of the first and second groups including a plurality of adjacent ones of the conductive materials, and
wherein a distance between the first group and the second group is greater than a distance between adjacent conductive materials in the first group.

17. The nonvolatile memory of claim 16, wherein the nonvolatile memory is configured to erase memory cells associated with the first group independently of memory cells associated with the second group.

18. The nonvolatile memory of claim 17, wherein the conductive materials comprise word lines.

19. The nonvolatile memory of claim 18, further comprising a dummy word line that is interposed between the conductive materials of the first group and the conductive materials of the second group.

20. The nonvolatile memory of claim 16, wherein the conductive material of the first group that is farthest from the conductive materials of the second group is wider than the remainder of the conductive materials of the first group, and wherein the conductive material of the second group that is farthest from the conductive materials of the first group is wider than the remainder of the conductive materials of the second group.

* * * * *